(12) United States Patent
Philipp et al.

(10) Patent No.: US 8,896,045 B2
(45) Date of Patent: Nov. 25, 2014

(54) INTEGRATED CIRCUIT INCLUDING SIDEWALL SPACER

(75) Inventors: Jan Boris Philipp, Peekskill, NY (US); Thomas Happ, Tarrytown, NY (US)

(73) Assignee: Infineon Technologies AG, Neubiberg (DE)

( * ) Notice: Subject to any disclaimer, the term of this patent is extended or adjusted under 35 U.S.C. 154(b) by 1432 days.

(21) Appl. No.: 11/406,766

(22) Filed: Apr. 19, 2006

(65) Prior Publication Data
US 2007/0246782 A1  Oct. 25, 2007

(51) Int. Cl.
H01L 27/148 (2006.01)
H01L 27/108 (2006.01)
H01L 45/00 (2006.01)
H01L 27/24 (2006.01)

(52) U.S. Cl.
CPC ............ *H01L 45/06* (2013.01); *H01L 27/2436* (2013.01); *H01L 45/1675* (2013.01); *H01L 45/144* (2013.01); *H01L 45/1233* (2013.01); *H01L 45/148* (2013.01)
USPC ............................. 257/298; 257/225; 257/758

(58) Field of Classification Search
USPC ......................................... 257/225, 298, 758
See application file for complete search history.

(56) References Cited

U.S. PATENT DOCUMENTS

| | | | |
|---|---|---|---|
| 6,117,720 A | 9/2000 | Harshfield | |
| 7,135,696 B2 * | 11/2006 | Karpov et al. | 257/2 |
| 7,323,357 B2 * | 1/2008 | Seidl | 438/102 |
| 7,339,185 B2 * | 3/2008 | Song et al. | 257/3 |
| 7,364,937 B2 * | 4/2008 | Lowrey | 438/95 |
| 7,384,825 B2 * | 6/2008 | Park et al. | 438/133 |
| 7,622,307 B2 * | 11/2009 | Park et al. | 438/3 |
| 7,973,301 B2 * | 7/2011 | Happ et al. | 257/2 |
| 7,973,384 B2 * | 7/2011 | Happ et al. | 257/529 |
| 2003/0138463 A1 * | 7/2003 | Torres et al. | 424/400 |
| 2003/0151041 A1 * | 8/2003 | Chiang | 257/3 |
| 2004/0115372 A1 * | 6/2004 | Lowrey | 428/34.1 |
| 2005/0112896 A1 | 5/2005 | Hamann et al. | |
| 2005/0227496 A1 | 10/2005 | Park et al. | |
| 2005/0239243 A1 * | 10/2005 | Tran et al. | 438/239 |
| 2005/0263829 A1 | 12/2005 | Song et al. | |
| 2006/0091492 A1 * | 5/2006 | Lee et al. | 257/467 |
| 2007/0034921 A1 * | 2/2007 | Daley et al. | 257/296 |
| 2007/0082469 A1 * | 4/2007 | Peters | 438/584 |

(Continued)

FOREIGN PATENT DOCUMENTS

| | | |
|---|---|---|
| EP | 1308960 | 5/2003 |
| EP | 1308960 A3 | 5/2004 |

(Continued)

OTHER PUBLICATIONS

S.L. Cho et al., "Highly Scalable On-Axis Confined Cell Structure for High Density PRAM beyond 256Mb", 2005 Symposium on VLSI Technology, 2 pgs. (2005).

(Continued)

*Primary Examiner* — James Mitchell
(74) *Attorney, Agent, or Firm* — John S. Economou

(57) ABSTRACT

A memory cell includes a first electrode, a second electrode, a layer of phase change material extending from a first contact with the first electrode to a second contact with the second electrode, and a sidewall spacer contacting the second electrode and a sidewall of the layer of phase change material adjacent to the second contact.

20 Claims, 16 Drawing Sheets

(56) References Cited

U.S. PATENT DOCUMENTS

| | | | |
|---|---|---|---|
| 2007/0096162 A1* | 5/2007 | Happ et al. | 257/246 |
| 2007/0097739 A1* | 5/2007 | Happ et al. | 365/163 |
| 2007/0099377 A1* | 5/2007 | Happ et al. | 438/257 |
| 2007/0108430 A1* | 5/2007 | Lung | 257/4 |
| 2007/0117315 A1* | 5/2007 | Lai et al. | 438/257 |

FOREIGN PATENT DOCUMENTS

| | | |
|---|---|---|
| EP | 1542276 A3 | 8/2007 |
| EP | 1816680 A1 | 8/2007 |
| WO | 2007053474 A2 | 5/2007 |

OTHER PUBLICATIONS

S.J. Ahn et al., "Highly Reliable 50nm Contact Cell Technology for 256 Mb PRAM", submission to NVSMW, 2005.

A. Pirovano et al., "Scaling Analysis of Phase-Change Memory Technology", submission to NVSMW, 2006.

Lai et al., "OUM—A 180nm Nonvolatile Memory Cell Element Technology for Stand Alone and Embedded Applications", IEDM 2001.

Lai et al., "Current Status of the phase change memory and its future", IEDM, 4 pages (2003).

Hori, H. et al., "A Novel Cell Technology Using N-doped GeSbTe Films for Phase Change RAM", 2003 Symposium on VLSI Technology, 2 pgs. (2003).

Bez et al, "Chalcogenide Phase Change Memory: Scalable NVM for the Next Decade?", IEEE, 3 pages (2006).

The Notification of Reasons for Refusal from Korean Intellectual Property Office, for Patent Application No. 10-2007-0037937 mailed Mar. 19, 2008 (8 pages).

\* cited by examiner

INTEGRATED CIRCUIT INCLUDING SIDEWALL SPACER

This application is related to U.S. patent application Ser. No. 11/348,640, entitled "THERMAL ISOLATION OF PHASE CHANGE MEMORY CELLS," filed Feb. 7, 2006, and to U.S. patent application Ser. No. 11/260,346, entitled "PHASE CHANGE MEMORY CELL," filed Oct. 27, 2005, both of which are incorporated herein by reference.

BACKGROUND

Semiconductor chips provide memory storage for electronic devices and have become very popular in the electronic products industry. In general, many semiconductor chips are typically fabricated (or built) on a silicon wafer. The semiconductor chips are individually separated from the wafer for subsequent use as memory in electronic devices. In this regard, the semiconductor chips include memory cells. One type of a memory cell is a resistive memory cell that is configured to store retrievable data, often characterized by the logic values of 0 and 1.

Phase change memory cells are one type of memory cell capable of resistively storing retrievable data between two or more separate states (or phases). In one known structure of a phase change memory cell, the memory cell is formed at the intersection of a phase change memory material and an electrode. Delivering an appropriate amount of energy to the electrode heats the phase change memory cell, thus affecting a phase/state change in its atomic structure. The phase change memory cell can be selectively switched between logic states 0 and 1, for example, and/or selectively switched between multiple logic states.

Materials that exhibit the above-noted phase change memory characteristics include the elements of Group VI of the periodic table (such as Tellurium and Selenium) and their alloys, referred to as chalcogenides or chalcogenic materials. Other non-chalcogenide materials also exhibit phase change memory characteristics.

The atomic structure of one type of phase change memory cell can be switched between an amorphous state and one or more crystalline states. In this regard, the atomic structure can be switched between a general amorphous state and multiple crystalline states. The amorphous state has greater electrical resistance than the crystalline state(s), and typically includes a disordered atomic structure. In contrast, the crystalline states each generally have a highly ordered atomic structure, and the more ordered the atomic structure of the crystalline state, the lower the electrical resistance (and the higher the electrical conductivity).

When switching between memory/phase states the atomic structure of a phase change material becomes highly ordered (crystalline) when maintained at (or slightly above) the crystallization temperature. To switch the memory material back to the amorphous state, the local temperature is generally raised above the melting temperature (approximately 600 degrees Celsius in the case of Ge2Sb2Te5) to achieve a highly random atomic structure, and then rapidly cooled to "lock" the atomic structure in the amorphous state.

The temperature-induced changes in phase/state may be achieved in a variety of ways. For example, a laser can be directed to the phase change material, current can be driven through the phase change material, or current can be passed through a resistive heater adjacent the phase change material. In any of these methods, controlled heating of the phase change material causes controlled phase change within the phase change material.

The variation in electrical resistance between the amorphous state and the crystalline state(s) in phase change materials can be beneficially employed in two level or multiple level systems where the resistivity is either a function of the bulk material or a function of the partial material. Manipulating the states of the chalcogenide permits a selective control over the electrical properties of the chalcogenide, which is useful in the storage and retrieval of data from the memory cell containing the chalcogenide.

During fabrication of memory cells, portions of a pre-processed wafer are etched to define the individual cell structure. Variations in the fabricated layers of the memory cell structure can lead to non-uniform thicknesses of the layers that are deposited onto the pre-processed wafer. This in turn can lead to over-etching of one or more layers of the memory cell. Over-etching of the phase change layer in the memory cells can create structural inhomogeneity between memory cells, and can affect the collective performance of the memory cells. In particular, during etching of a metallic bottom electrode that is in contact with a phase change material, the phase change material is etched, and in some cases, undesirably over-etched.

For these and other reasons, there is a need for the present invention.

SUMMARY

One aspect of the present invention provides a memory cell. The memory cell includes a first electrode, a second electrode, a layer of phase change material extending from a first contact with the first electrode to a second contact with the second electrode, and a sidewall spacer contacting the second electrode and a sidewall of the layer of phase change material adjacent to the second contact.

BRIEF DESCRIPTION OF THE DRAWINGS

The accompanying drawings are included to provide a further understanding of the present invention and are incorporated in and comprise a part of this specification. The drawings illustrate embodiments of the present invention and together with the detailed description describe principles of the present invention. Other embodiments of the present invention, and many of the intended advantages of the present invention, will be readily appreciated as they become better understood by reference to the following detailed description. The elements of the drawings are not necessarily to scale relative to each other. Like reference numerals designate corresponding similar parts.

DETAILED DESCRIPTION

Figure 1:
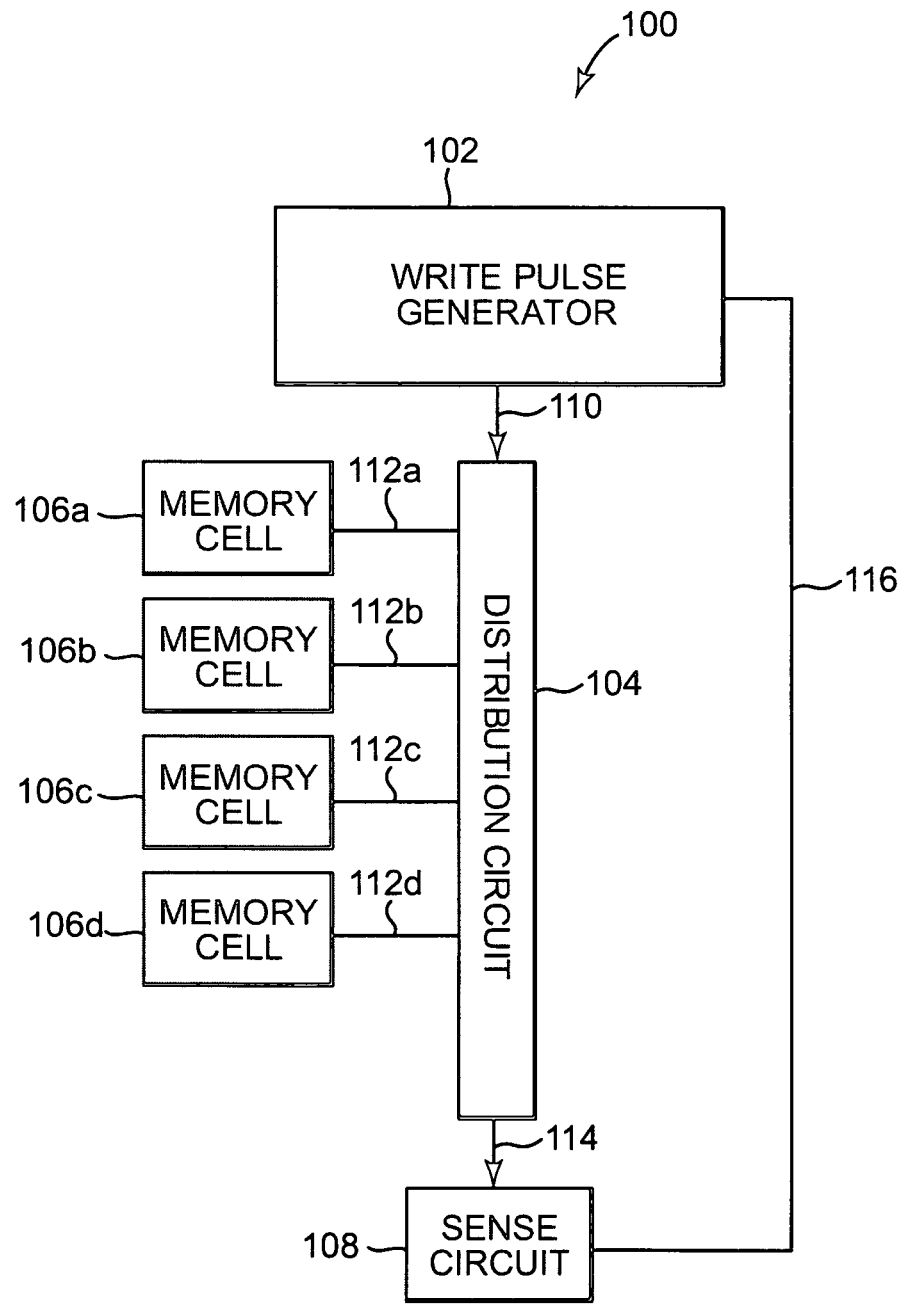
FIG. 1 illustrates a simplified block diagram of a memory device according to one embodiment of the present invention.

FIG. 1 illustrates a simplified block diagram of a memory device 100 according to one embodiment of the present invention. Memory device 100 includes a write pulse generator 102, a distribution circuit 104, memory cells 106a, 106b, 106c, and 106d, and a sense circuit 108. In one embodiment, memory cells 106a-106d are phase change memory cells that beneficially employ an amorphous-crystalline phase transition of memory material within the cell for storing data in the memory. Write pulse generator 102 is electrically coupled to distribution circuit 104 through signal path 110. Distribution circuit 104 is electrically coupled to memory cells 106a-106d through signal paths 112a-112d, respectively, and to sense circuit 108 through signal path 114. Write pulse generator 102 is electrically coupled to sense circuit 108 through a signal path 116. Each of the memory cells 106a-106d can be programmed into a memory state associated with a particular resistance value, and the resistance value is controlled using a suitable electrical write strategy.

As used herein the term "electrically coupled" is not meant to mean that the elements must be directly coupled together, and intervening elements may be provided between the "electrically coupled" elements.

Some phase change materials exhibit more than one crystalline phase. For example, a low temperature crystalline state may have a lower electrical resistance than the amorphous state, and a high-temperature crystalline state may have an electrical resistance that is lower than both the lower temperature crystalline state and the amorphous state. However, the transition of the phase change material into the higher temperature crystalline state is not generally desirable because a large current is required to switch the phase change material from the high temperature crystalline state back to the amorphous state.

In one embodiment, each phase change memory cell 106a-106d includes phase change material providing a data storage location. The active region for the phase change memory cell is where the phase change material transitions between the crystalline state and the amorphous state for storing one bit, 1.5 bits, two bits, or several bits of data.

In one embodiment, write pulse generator 102 generates current or voltage pulses that are controllably directed to memory cells 106a-106d via distribution circuit 104. In one embodiment, distribution circuit 104 includes a plurality of transistors that controllably direct current or voltage pulses to the memory cells.

In one embodiment, memory cells 106a-106d include a phase change material that can be changed from an amorphous state to a crystalline state, or from a crystalline state to an amorphous state, under influence of a temperature change. The degree of crystallinity defines at least two memory states useful for storing data within memory device 100. The memory state(s) can be assigned to the bit values, such as bit values "0" and "1." The bit states of memory cells 106a-106d differ significantly in their electrical resistivity. In the amorphous state, a phase change material exhibits significantly higher resistivity than in the crystalline state. In this manner, sense amplifier 108 reads the cell resistance such that the bit value assigned to a particular memory cell 106a-106d is determined.

To program one of the memory cells 106a-106d within memory device 100, write pulse generator 102 generates a current or voltage pulse for heating the phase change material in the target memory cell. In one embodiment, write pulse generator 102 generates an appropriate current or voltage pulse, which is fed into distribution circuit 104 and distributed to the appropriate target memory cell 106a-106d. The current or voltage pulse amplitude and duration is controlled depending on whether the memory cell is being set or reset. Generally, a "set" operation of a memory cell heats the phase change material of the target memory cell above its crystallization temperature (but below its melting temperature) long enough to achieve the crystalline state. Generally, a "reset" operation of a memory cell heats the phase change material of the target memory cell above its melting temperature, and then quickly quenches/cools the material, thereby achieving the amorphous state.

Figure 2:
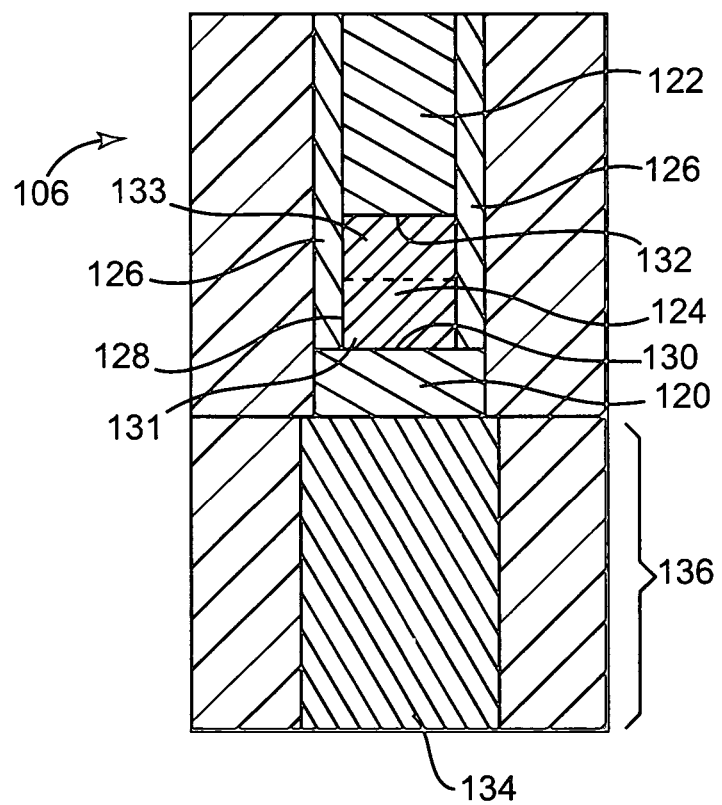
FIG. 2 illustrates a cross-sectional view of a memory cell according to one embodiment of the present invention.

FIG. 2 illustrates a cross-sectional view of a memory cell 106 according to one embodiment of the present invention. In one embodiment, memory cell 106 includes a dedicated electrode 120, a second electrode 122, a layer 124 of phase change material extending between dedicated electrode 120 and second electrode 122, and a sidewall 126 contacting the second electrode 122 and a sidewall 128 of layer 124 of phase change material. In one embodiment, layer 124 of phase change material extends from a first contact 130 with the dedicated electrode 120 to a second contact 132 with second electrode 122. In one embodiment, first contact 130 is a lower contact and second contact 132 is an upper contact 132, although other orientations are acceptable.

In one embodiment, dedicated electrode 120 contacts an electrode plug 134 within a portion of a pre-processed wafer 136 and provides improved interface control for subsequent processing. In another embodiment, dedicated electrode 120 is optional, and layer 124 of phase change material contacts electrode plug 134 directly. Dedicated electrode 120 and second electrode 122 include titanium nitride (TiN), tantalum nitride (TaN), tungsten (W), or other suitable electrode material. In one embodiment, electrode plug 134 is a TiN plug, a tungsten plug, a copper plug, or a plug of other suitable electrode material.

Layer 124 of phase change material can be fabricated from a variety of materials in accordance with the present invention. In one embodiment, layer 124 of phase change material includes chalcogenide alloys having one or more elements from Group VI of the periodic table, such as Tellurium and/or Selenium and/or Sulfur, and their alloys. In another embodiment, layer 124 of phase change material is chalcogen-free, i.e., a phase change material that does not contain Tellurium, Selenium, or Sulfur, or alloys of Tellurium, Selenium, or Sulfur. Suitable materials for layer 124 of phase change material include, for example, GeSbTe, SbTe, GeTe, AgInSbTe, GeSb, GaSb, InSb, GeGaInSb. In other embodiments, layer 124 includes a suitable material including one or more of the elements Ge, Sb, Te, Ga, As, In, Se, and S. In addition, layer 124 of phase change material may be selectively doped with nitrogen, oxygen, silicon, or other suitable materials.

Layer 124 defines at least one dimension related to film thickness, where a thickness dimension of layer 124 is less than about 100 nanometers (nm). For example, in one embodiment, spacer layer 124 is a phase change material as described above and has a dimension that is between about 100 nanometers and 5 nanometers.

In one embodiment, layer 124 of phase change material includes a first stack 131 of phase change material in contact with a second stack 133 of phase change material. In one embodiment, first stack 131 of phase change material is different in composition relative to second stack 133 of phase change material.

In general, sidewall spacer 126 includes material having a lower electrical conductivity than phase change material in layer 124 in its crystalline state. In one embodiment, sidewall spacer 126 is an insulation dielectric and includes, for example, silicon dioxide ($SiO_2$), SiOCH, or other suitable low-k materials. Preferably, sidewall spacer 126 is a suitable insulation material that defines an etch rate for plasma etchants that is lower than an etch rate for layer 124 of phase change material. During bottom electrode etching, for example, low etch rate sidewall spacer 126 protects and improves homogeneity of layer 124. Improved homogeneity of layer 124 relates to improved structural integrity and improved, uniform electrical characteristics of layer 124.

In one embodiment, sidewall spacer 126 is a multi-layer structure including at least one stress layer and one insulation layer. In one embodiment, stress layer of sidewall spacer 126 includes a densified layer of silicon nitride, such as $Si_3N_4$, or other suitable stress layer materials.

FIGS. 3A-10 illustrate various embodiments of sidewall spacer 126 employed to minimize or limit uncontrolled over-etching of layer 124 during, for example, bottom electrode 120 etching.

Figure 3A:
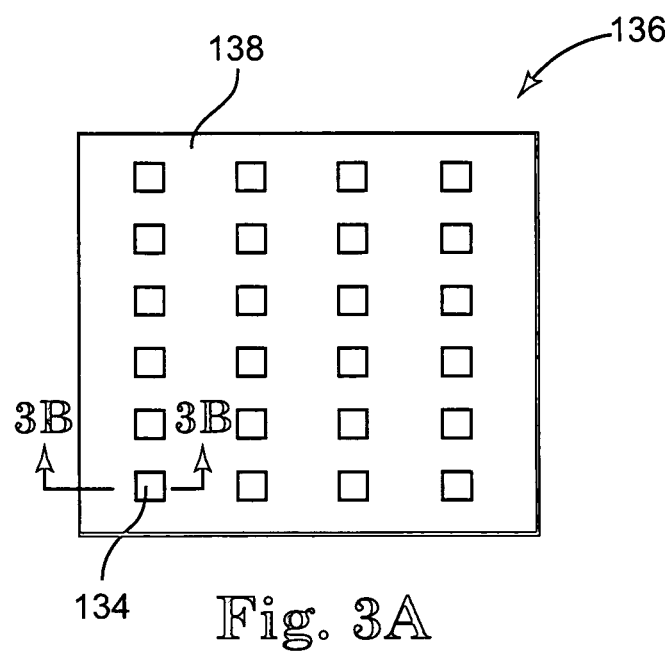
FIG. 3A illustrates a top view of a pre-processed wafer according to one embodiment of the present invention.

FIG. 3A illustrates a top view of a pre-processed wafer 136 according to one embodiment of the present invention. Pre-processed wafer 136 includes electrode plugs 134 disposed in a dielectric field 138. Dielectric field 138 is, in general, an insulating field and can include an oxide field, a nitride field, or other dielectric material having suitable thermal etch and electrical characteristics. With this in mind, dielectric field 138 is also referred to as an insulator 138. Insulator 138 can include silicon dioxide, fluorinated silica glass (FSG), or other suitable dielectric materials.

Figure 3B:
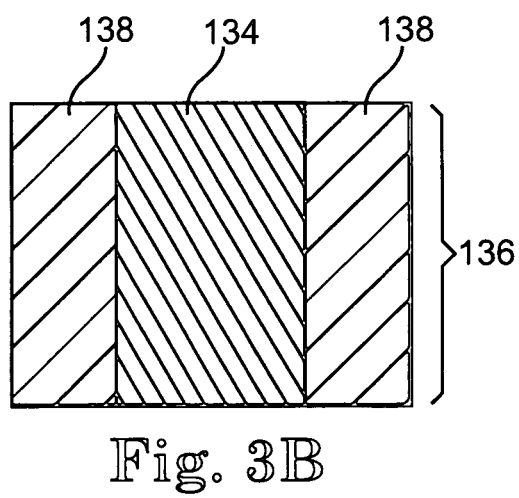
FIG. 3B illustrates a cross-sectional view of a portion of the pre-processed wafer illustrated in FIG. 3A showing an electrode plug in an insulation field according to one embodiment of the present invention.

FIG. 3B illustrates a cross-sectional view of a portion of pre-processed wafer 136 according to one embodiment of the present invention. Electrode plug 134 is laterally surrounded by insulator 138 and prepared for subsequent processing.

Figure 4:
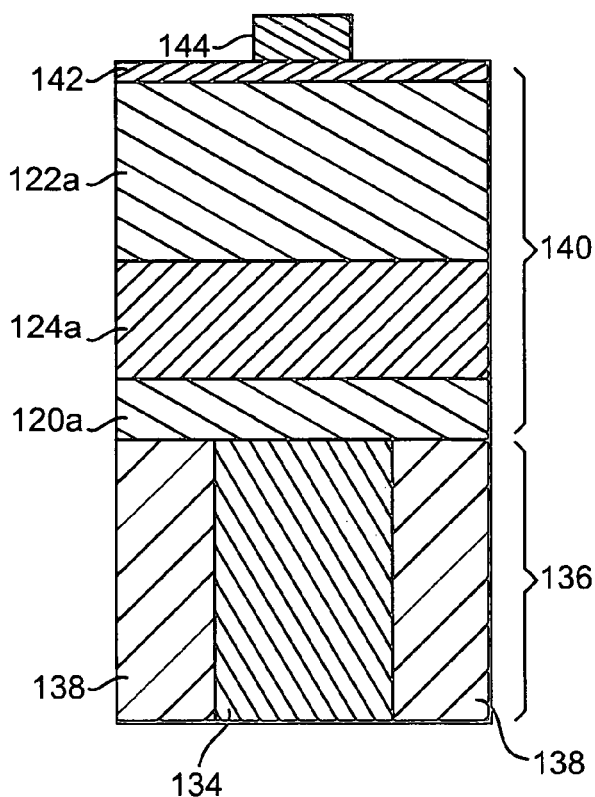
FIG. 4 illustrates a cross-sectional view of a memory cell stack disposed on the electrode plug of the pre-processed wafer shown in FIG. 3B according to one embodiment of the present invention.

FIG. 4 illustrates a cross-sectional view of a memory cell stack 140 according to one embodiment of the present invention. Memory cell stack 140 is disposed on pre-processed wafer 136 and includes a dedicated electrode layer 120a, a second electrode layer 122a, and a layer 124a of phase change material extending between dedicated electrode layer 120a and second electrode layer 122a. In addition, memory cell stack 140 includes hard mask layer 142 deposited onto second electrode layer 122a, and a photo resist layer 144 deposited on hard mask layer 142. In one embodiment, hard mask 142 is a stop etch layer including silicon nitride, such as SiN, or SiON, or other suitable stop etch materials.

Dedicated electrode layer 120a can be deposited using chemical vapor deposition (CVD), atomic layer deposition (ALD), metal organic chemical vapor deposition (MOCVD), plasma vapor deposition (PVD), jet vapor deposition (JVD), or other suitable depositions techniques.

Layer 124a and second electrode layer 122a are likewise deposited employing suitable deposition techniques. For example, in various embodiments of the present invention layer 124 of phase change material and second electrode layer 122a are deposited using one of CVD, ALD, MOCVD, PVD, JVD, or other suitable deposition techniques.

In one embodiment, photo resist 144 is spin coated onto hard mask 142, and the photo resist is employed to pattern hard mask 142. Photo resist layer 144 can include photo resist materials useful in, for example, optical lithography. In one embodiment, a size of the photoresist is reduced after lithography by reactive ion trimming. In one embodiment, hard mask 142 is a silicon nitride or a silicon oxynitride deposited by a suitable deposition technique, such as CVD, ALD, MOCVD, PVD, and/or JVD. In one embodiment, resist 144 is trimmed, hard mask 142 is opened, resist 144 is stripped, and memory cell stack 140 is etched.

Figure 5:
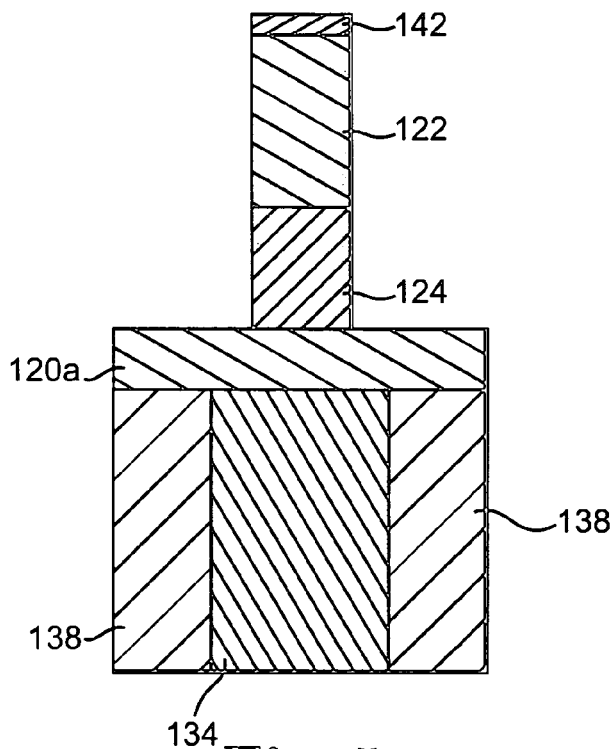
FIG. 5 illustrates a cross-sectional view of the memory cell stack shown in FIG. 4 after a partial etch and strip process according to one embodiment of the present invention.

FIG. 5 illustrates a cross-sectional view of memory cell stack 140 (FIG. 4) after an etch and strip process according to one embodiment of the present invention. Memory cell stack 140 has been vertically etched down to dedicated electrode layer 120a, and a width of etched memory cell stack 140 is approximately the width of photo resist layer 144 after trimming (FIG. 4). After etching, photo resist layer 144 is stripped to expose remaining hard mask 142. Alternatively, photoresist layer 144 is already stripped after the hard mask 142 is opened.

Figure 6:
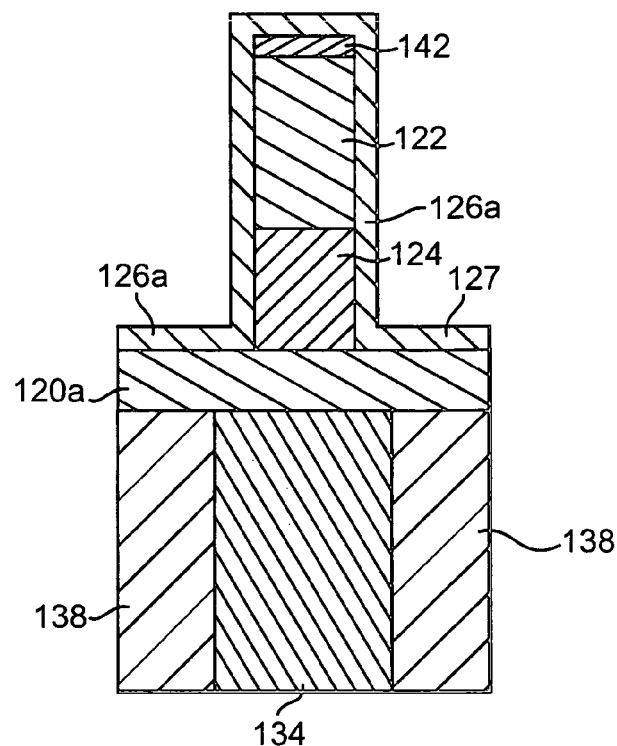
FIG. 6 illustrates a cross-sectional view of a sidewall spacer layer deposited onto the etched and stripped memory cell stack of FIG. 5 according to one embodiment of the present invention.

FIG. 6 illustrates a cross-sectional view of a sidewall spacer layer 126a deposited over the etched memory cell stack shown in FIG. 5 according to one embodiment of the present invention. Sidewall spacer layer 126a defines a lateral spacer 127 in contact with lateral portions of dedicated electrode layer 120a, and a remaining vertical spacer in contact with vertical portions of layer 124 of phase change material and second electrode 122. In one embodiment, sidewall spacer layer 126a includes one of SiN, SiON, SiO2, or a low-k dielectric material and is deposited using CVD, ALD, MOCVD, PVD, JVP, or other suitable deposition techniques.

Figure 7:
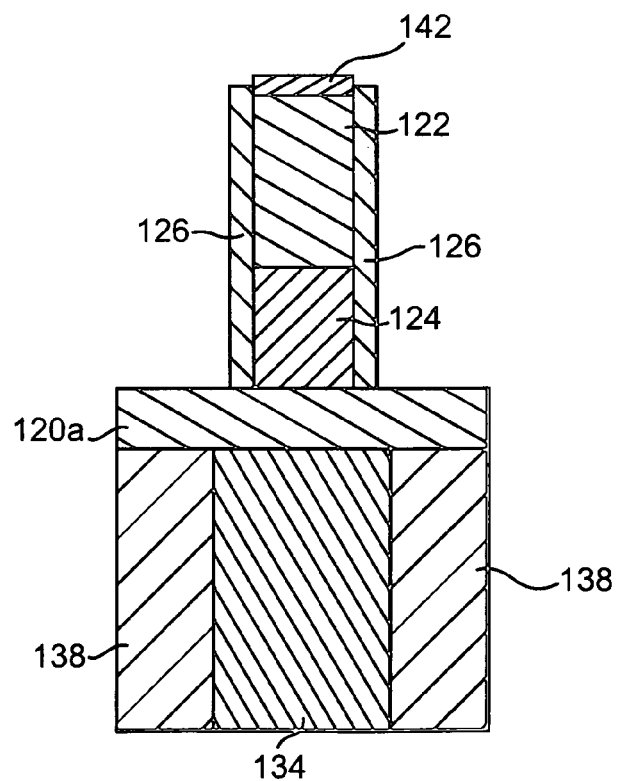
FIG. 7 illustrates a cross-sectional view of the sidewall spacer layer shown in FIG. 6 after an anisotropic spacer etch according to one embodiment of the present invention.

FIG. 7 illustrates a cross-sectional view of a vertical sidewall spacer 126 according to one embodiment of the present invention. In one embodiment, sidewall spacer layer 126a (FIG. 6) is anisotropically etched to remove lateral spacer 127 (FIG. 6) of spacer layer 126a from dedicated electrode layer 120a and hard mask 144 (FIG. 6). In one embodiment, lateral spacer 127 of sidewall spacer layer 126a is removed by a directed top down etch to remove horizontal portions (i.e., lateral portions, or lateral spacer 127) of sidewall spacer layer 126a. After anisotropic etching of spacer layer 126a, a vertical sidewall spacer 126 remains in contact with layer 124 of phase change material and second electrode 122. In one embodiment, sidewall spacer 126 is a sidewall protection spacer configured to protect layer 124 of phase change material during subsequent etching of a bottom electrode, for example dedicated electrode layer 120a, from harsh halogen etch chemistry. It is desired that sidewall spacer 126 have an etch rate that is lower than an etch rate for layer 124 for the given etching chemistry, such that during etching of bottom electrode layer 120a, over-etching of layer 124 is minimized or reduced.

Figure 8:
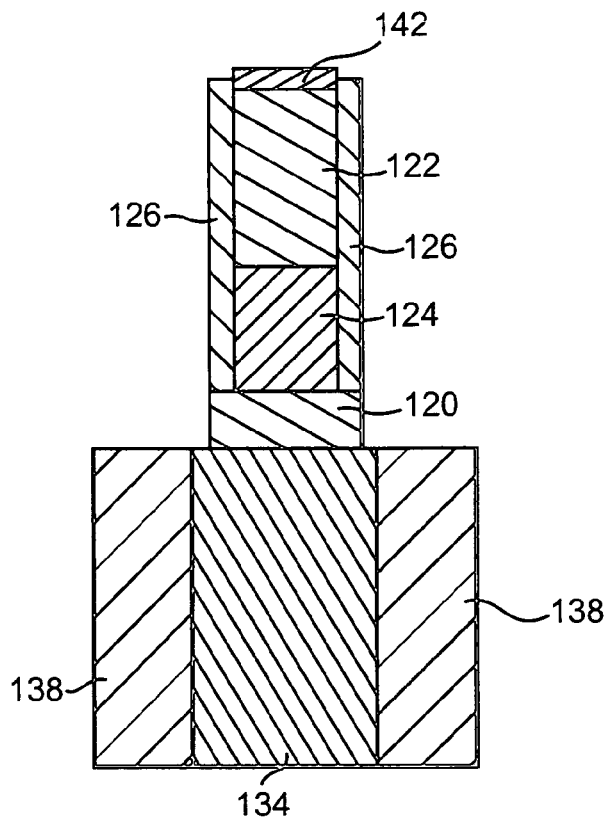
FIG. 8 illustrates a cross-sectional view of a memory cell stack after a bottom electrode separation etch according to one embodiment of the present invention.

FIG. 8 illustrates a cross-sectional view of dedicated electrode 120 according to one embodiment of the present invention. In one embodiment, dedicated electrode layer 120a (FIG. 7) is separation etched down to a top portion of pre-processed wafer 136 (FIG. 2) to define a patterned bottom electrode. In one embodiment, the separation etch of dedicated electrode layer 120a is a self-aligned bottom electrode separation etch employing a chlorine plasma. One aspect of the invention provides sidewall spacer 126 that prevents further etching or degradation of layer 124 of phase change material during the bottom electrode separation etch.

Figure 9:
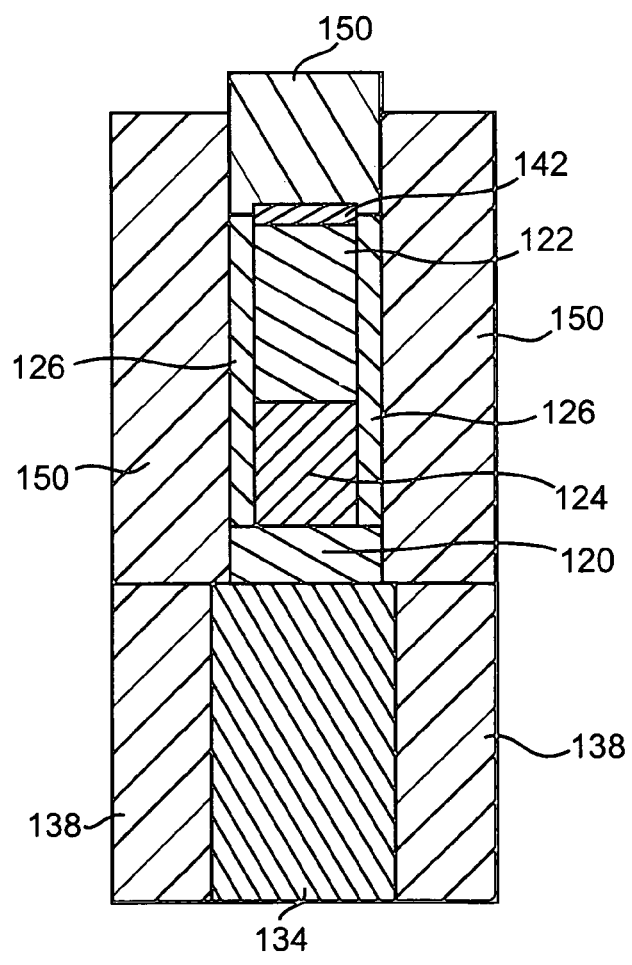
FIG. 9 illustrates a cross-sectional view of the memory cell stack shown in FIG. 8 after deposition of an interlayer dielectric according to one embodiment of the present invention.

FIG. 9 illustrates a cross-sectional view of a dielectric material 150 disposed around sidewall spacer 126 according to one embodiment of the present invention. In one embodiment, an interlayer dielectric 150 is deposited to surround portions of dedicated electrode 120, sidewall spacer 126, and hard mask 144. In one embodiment, interlayer 150 is insulation material similar to insulator 138. In one embodiment, electrodes 120, 122 and layer 124 of phase change material are laterally completely enclosed by insulation material 150.

Figure 10:
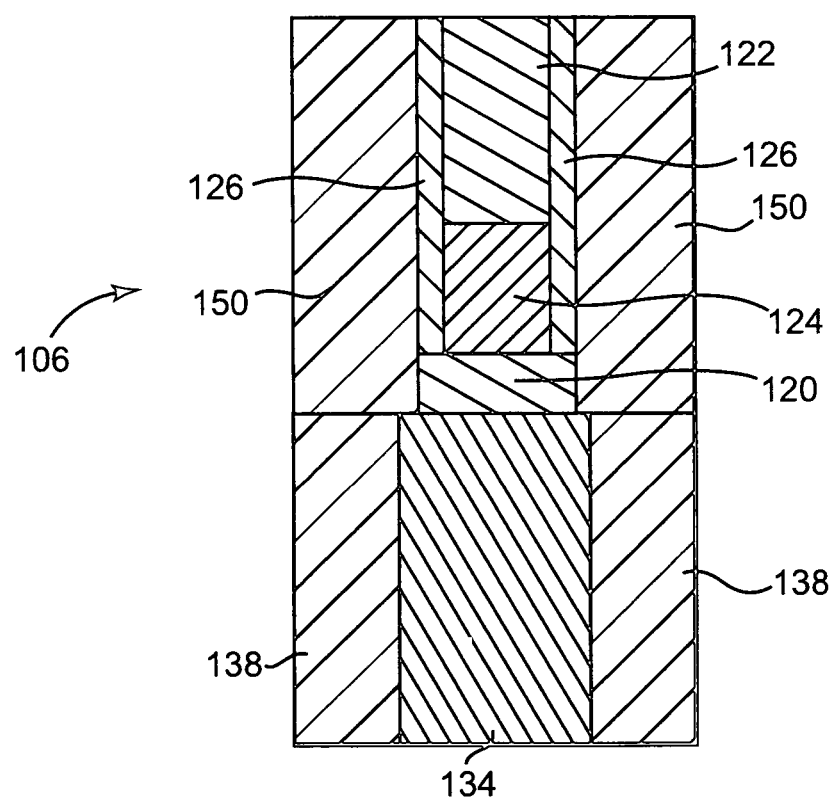
FIG. 10 illustrates a cross-sectional view of a planarized memory cell suitable for subsequent wiring/processing according to one embodiment of the present invention.

FIG. 10 illustrates a cross-sectional view of memory cell 106 according to one embodiment of the present invention. In one embodiment, insulation material 150 (FIG. 9) is planarized using a chemical mechanical polishing (CMP), or other suitable planarizing techniques, to define memory cell 106, which is thereafter configured for subsequent further wiring/processing in accordance with aspects of the present invention.

Memory cell 106 includes layer 124 of phase change material extending between dedicated electrode 120 and second electrode 122, where layer 124 of phase change material has improved structural homogeneity. For example, layer 124 of phase change material is protected by sidewall spacer 126 from deleterious or undesired over etching during bottom electrode separation processing.

During processing of memory cell 106, there is a potential for a non-uniform top electrode layer, for example electrode 122, to include a non-uniform thickness that makes an exact end pointing of a pillar etch processing difficult. Consequently, certain amounts of over etching can occur and affect components of memory cell 106. Over etching can lead to uncontrolled undercutting of layer 124, that in turn leads to sputter redeposition of undesired (i.e., later and additional) sidewall coatings on pillar cell 106.

Embodiments of this invention provide sidewall spacer 126 that protects against over etching of sidewall portions of layer 124 of phase change material. In one embodiment, sidewall spacer 126 has an etch rate that is lower than an etch rate of layer 124, such that sidewall spacer 126 protects against over etching of sidewall portions of layer 124 of phase change material.

Figure 11A:
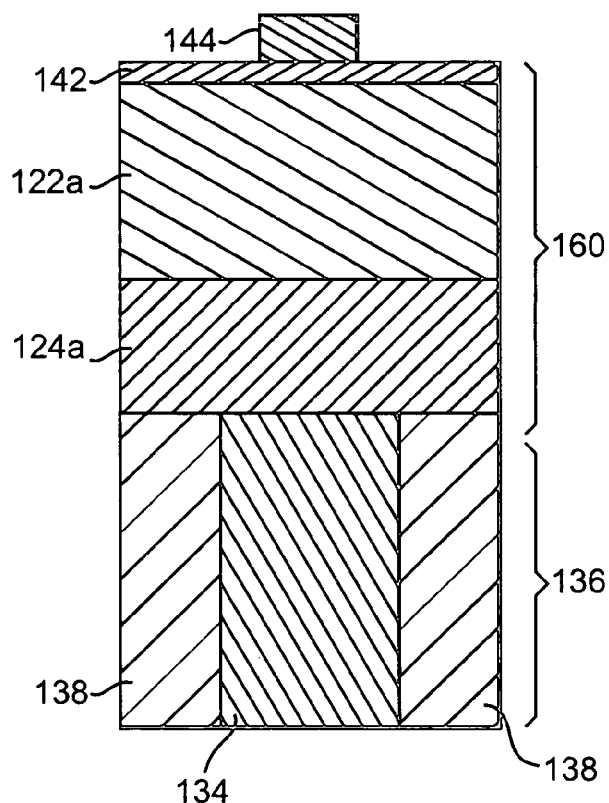
FIG. 11A illustrates a cross-sectional view of a memory cell stack disposed on a pre-processed wafer according to another embodiment of the present invention.

FIG. 11A illustrates a cross-sectional view of another memory cell stack 160 according to one embodiment of the present invention. In one embodiment, memory cell stack 160 is deposited on top of pre-processed wafer 136. In one embodiment, electrode layer 120a (FIG. 4) is optional and not included as part of memory cell stack 160. In one embodiment, memory cell stack 160 includes layer 124a of phase change material deposited directly onto electrode plug 134, second electrode layer 122a disposed on top of layer 124a, hard mask layer 142 deposited on second electrode layer 122a, and photo resist 144 deposited onto hard mask layer 142. In one embodiment, photo resist layer 144 and hard mask 142 are similar to the photo resist and hard mask materials described in FIG. 4 above.

Figure 11B:
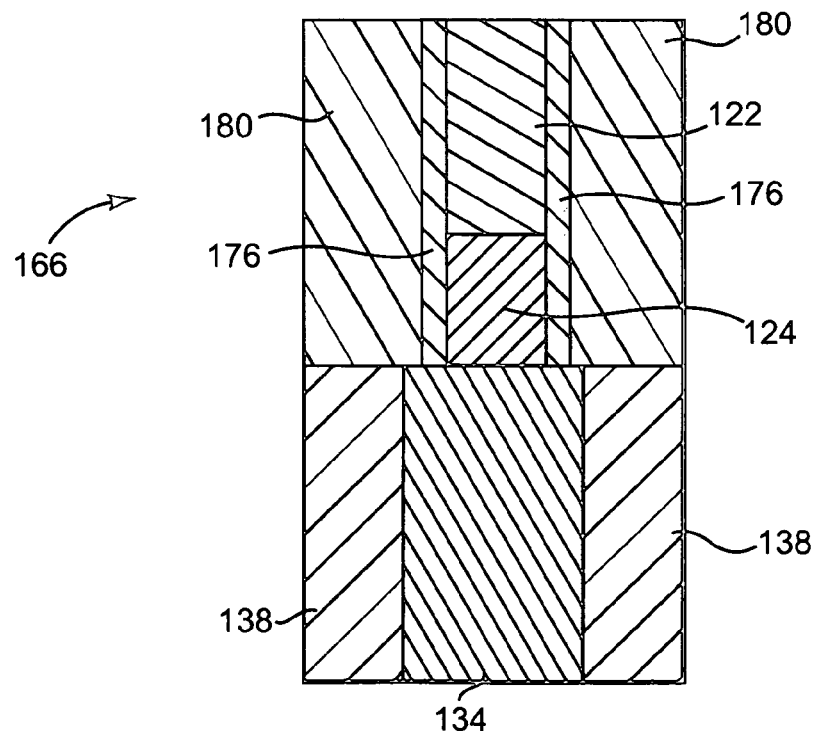
FIG. 11B illustrates a cross-sectional view of a memory cell according to another embodiment of the present invention.

FIG. 11B illustrates a cross-sectional view of a memory cell 166 fabricated from memory cell stack 160 according to one embodiment of the present invention. In one embodiment, layer 124 of phase change material extends between electrode plug 134 and second electrode 122. A sidewall spacer 176 contacts a sidewall of layer 124 of phase change material and second electrode 122. An insulator material 180 is provided to insulate portions of memory cell 166. After processing memory cell stack 160 (FIG. 11A) in a manner substantially similar to the processes described in FIGS. 5-10 above, memory cell 166 is suited for subsequent further wiring/processing.

FIGS. 12-25 provide various other embodiments of a memory cell that includes a sidewall spacer configured to protect a layer of phase change material during etching, and in particular, to protect layer of phase change material from over etching during bottom electrode separation etching. Aspects of the invention provide for a sidewall spacer that additionally covers a layer of phase change material to further insulate hot spots in the phase change material during memory set and memory reset. In various embodiments, the sidewall spacer laterally encloses a layer of phase change material, and the sidewall spacer and layer of phase change material, when etched, provide for a wider base in contact with a bottom electrode that improves the structural integrity of the pillar phase change cell and the electrical characteristics of the phase change memory.

Figure 12:
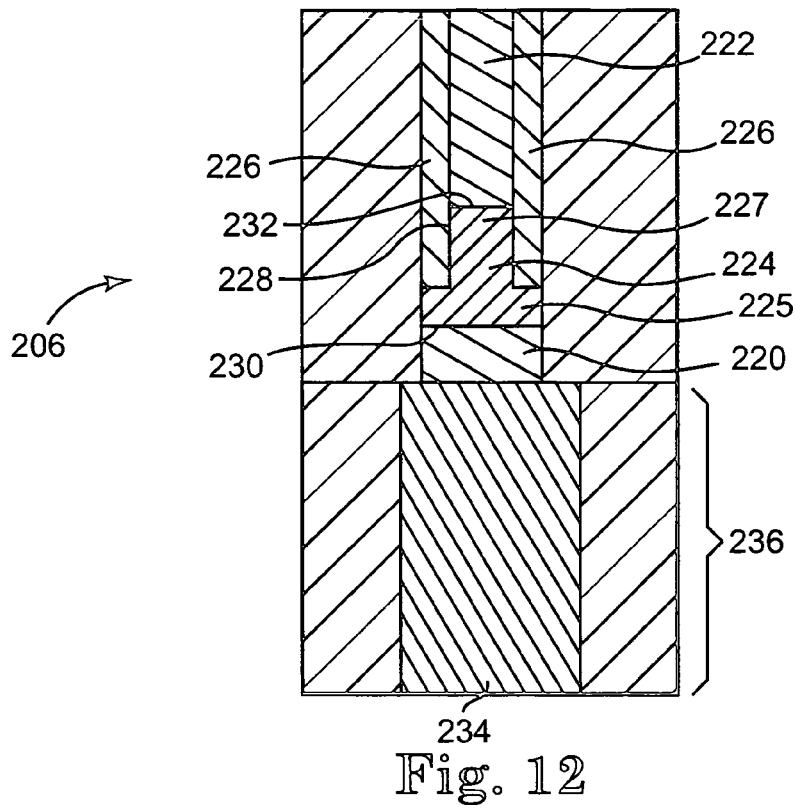
FIG. 12 illustrates a cross-sectional view of a memory cell according to another embodiment of the present invention.

FIG. 12 illustrates a cross-sectional view of a memory cell 206 according to another embodiment of the present invention. In one embodiment, memory cell 206 includes a first electrode 220, a second electrode 222, a layer 224 of phase change material extending from first electrode 220 to second electrode 222, and a sidewall spacer 226 in contact with second electrode 222 and a sidewall 228 of layer 224.

In one embodiment, layer 224 of phase change material extends from a lower contact 230 of first electrode 220 to an upper contact 232 of second electrode 222. In one embodiment, layer 224 of phase change material includes a base 225 and a pillar 227 extending from base 225. As illustrated in FIG. 12, base 225 contacts first electrode 220 along lower contact 230, and pillar 227 contacts second electrode 222 along upper contact 232.

In one embodiment, base 225 is laterally disposed on first electrode 220, and pillar 227 is narrower than base 225 such that pillar 227 contacts only a portion of base 225. In one embodiment, pillar 227 extends orthogonally from base 225, although other orientations of pillar 227 relative to base 225 are acceptable.

In one embodiment, first electrode 220 contacts an electrode plug 234 of a pre-processed wafer 236. In this regard, electrode plug 234 and pre-processed wafer 236 are substantially similar to electrode plug 134 and pre-processed wafer 136 illustrated in FIGS. 3A and 3B.

Figure 13:
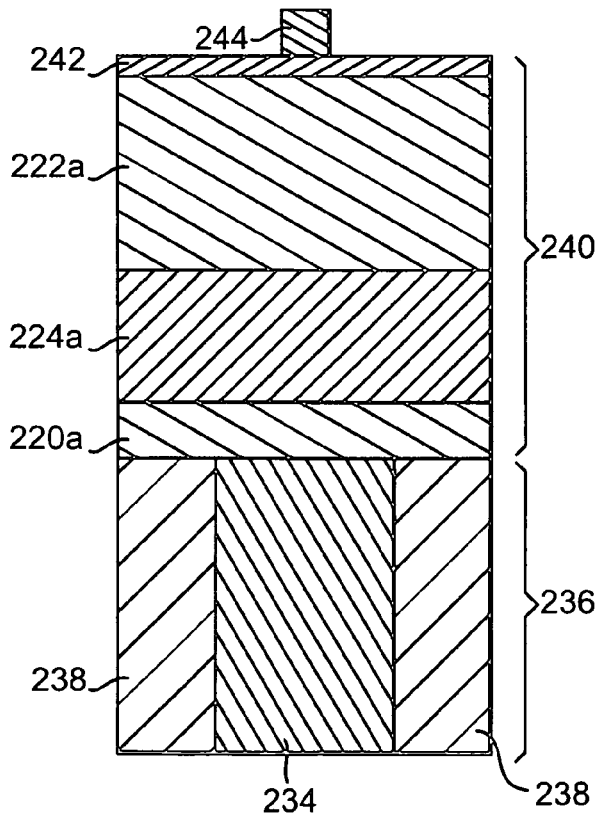
FIG. 13 illustrates a cross-sectional view of a memory cell stack disposed on a pre-process wafer according to one embodiment of the present invention.

FIG. 13 illustrates a cross-sectional view of a memory cell stack 240 disposed on a pre-processed wafer 236 according to one embodiment of the present invention. Pre-processed wafer 236 includes a plurality of electrode plugs 234 disposed in an insulation field 238. It is to be understood that although FIG. 13 illustrates one electrode plug 234, in general a pre-processed wafer such as wafer 236 will include many electrode plugs disposed in an insulation field (for example, substantially as shown in FIGS. 3A and 3B).

Memory cell stack 240 includes first electrode layer 220a, second electrode layer 222a, a layer 224a of phase change material extending between first electrode layer 220a and second electrode layer 222a, a hard mask 242 deposited onto second electrode layer 222a, and a photo resist layer 244 contacting hard mask 242. In one embodiment, photo resist layer 244 and hard mask 242 are similar to the photo resist and hard mask materials described in FIG. 4 above.

Figure 14:
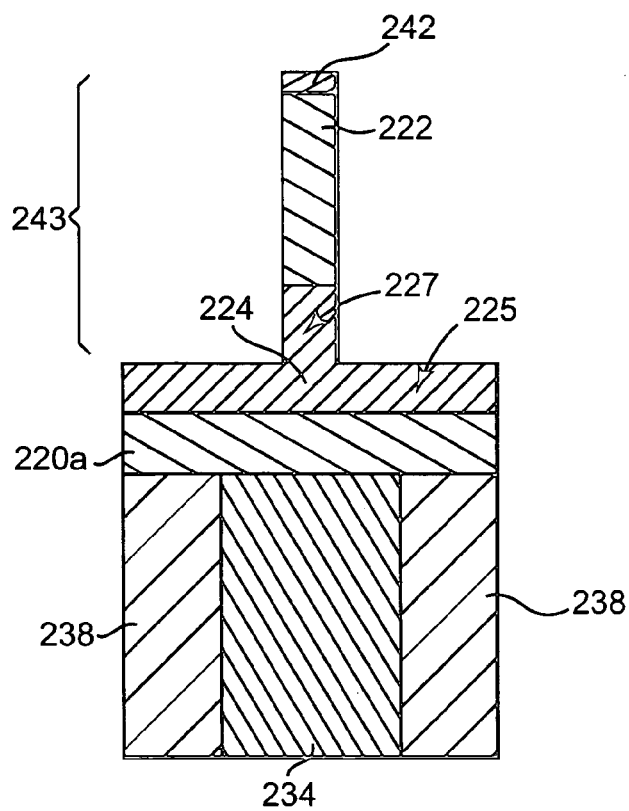
FIG. 14 illustrates a cross-sectional view of the memory cell stack illustrated in FIG. 13 after a partial etch and strip process according to one embodiment of the present invention.

FIG. 14 illustrates a cross-sectional view of a pillar stack 243 according to one embodiment of the present invention. Memory cell stack 240 (FIG. 13) has been etched to form storage location pillars, and the main pillar etch has been terminated within the layer 224 of phase change material such that layer 224 defines a base 225, and a pillar 227 extending from base 225. In this regard, pillar stack 243 includes a pillar 227 portion of layer 224 of phase change material, second electrode 222, and a remaining portion of hard mask 242 on second electrode 222.

In one embodiment, photo resist 244 is employed to etch pillar 227. Photo resist 244 is then stripped to expose pillar stack 243. Since main pillar etch has been terminated within base 225, a remaining portion of base 225 is provided that is wider than photo resist 244. In this regard, base 225 improves the structural integrity of pillar 227 and second electrode 222.

Figure 15:
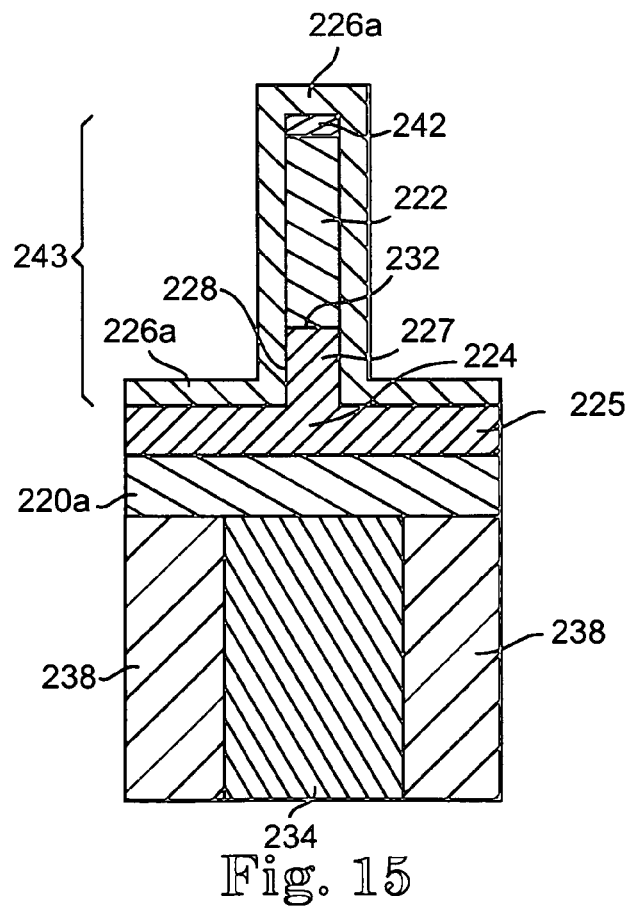
FIG. 15 illustrates a cross-sectional view of a sidewall spacer layer deposited onto the etched and stripped memory cell stack of FIG. 14 according to one embodiment of the present invention.

FIG. 15 illustrates a cross-sectional view of a sidewall spacer layer 226a deposited onto portions of pillar stack 243 according to one embodiment of the present invention. Sidewall spacer layer 226a is conformally deposited onto base 225 and extends in contact along a sidewall 228 of layer 224 of phase change material. In one embodiment, sidewall spacer layer 226a is a dielectric that is conformally deposited over pillar stack 243 in a CVD process. Other suitable deposition processes are also acceptable.

In one embodiment, sidewall spacer layer 226a contacts sidewall 228 of layer 224 of phase change material adjacent to upper contact 232 of second electrode 222. In one embodiment, sidewall spacer layer 226a is a multilayer structure that includes at least one stress layer, where the stress layer is configured to suppress a transition in the layer 224 of phase change material to a high temperature crystalline state.

Figure 16:
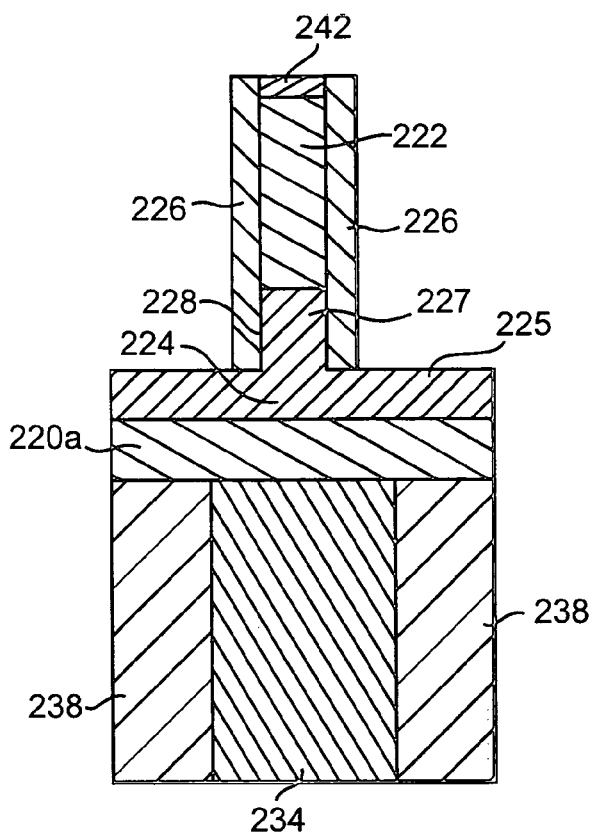
FIG. 16 illustrates a cross-sectional view of the sidewall spacer layer shown in FIG. 15 after an anisotropic spacer etch according to one embodiment of the present invention.

FIG. 16 illustrates a cross-sectional view of a sidewall spacer 226 according to one embodiment of the present invention. Pillar stack 243 (FIG. 15) is illustrated after an anisotropic spacer etch. During the anisotropic spacer etch, horizontal portions of sidewall spacer layer 226a (FIG. 15) are removed to provide sidewall spacer 226 in contact with sidewall 228 of layer 224 of phase change material. In one embodiment, sidewall spacer 226 surrounds pillar 227 and extends from base 225 to hard mask/stop etch 242.

Figure 17:
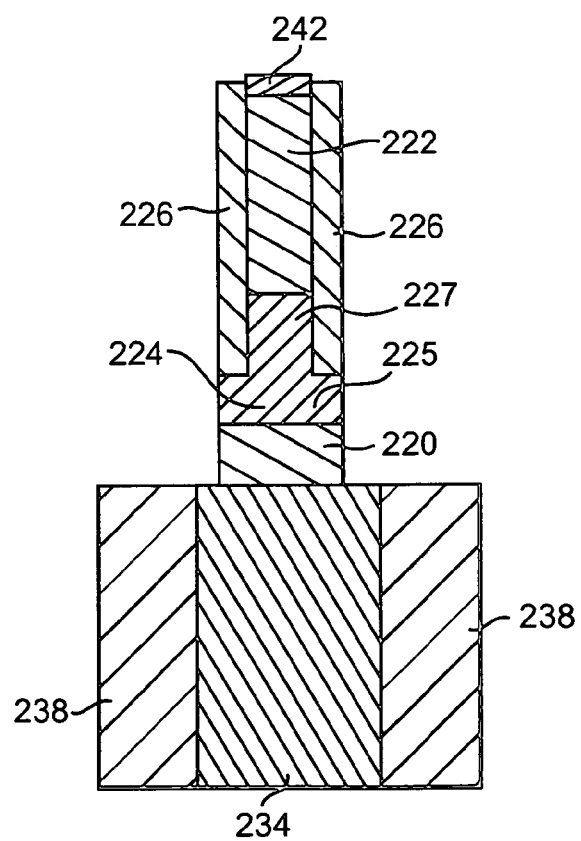
FIG. 17 illustrates a cross-sectional view of a memory cell stack after a bottom electrode separation etch according to one embodiment of the present invention.

FIG. 17 illustrates a cross-sectional view of patterned electrode 220 according to one embodiment of the present invention. In one embodiment, electrode layer 220a (FIG. 16) is separation etched to define patterned bottom electrode 220. In one embodiment, the separation etch of electrode layer 220a is a self-aligned bottom electrode separation etch employing a chlorine plasma. One aspect of the invention provides sidewall spacer 226 that prevents further etching or degradation of pillar 227 material during the bottom electrode separation etch.

Figure 18:
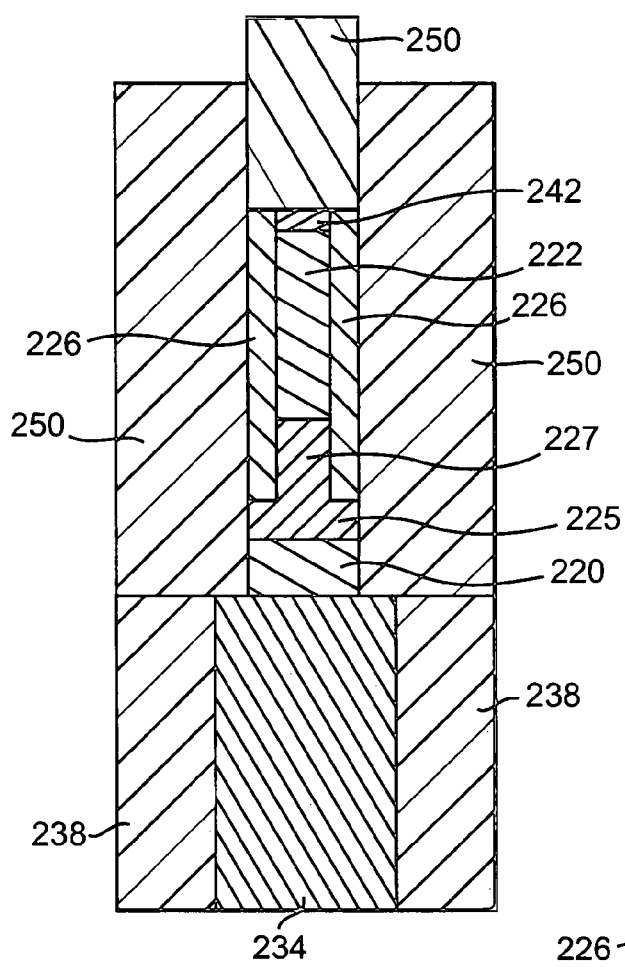
FIG. 18 illustrates a cross-sectional view of the memory cell stack shown in FIG. 17 after deposition of an interlayer dielectric according to one embodiment of the present invention.

FIG. 18 illustrates a cross-sectional view of an interlayer dielectric layer 250 according to one embodiment of the present invention. In one embodiment, interlayer 250 is deposited in a suitable deposition process to laterally and completely surround electrodes 220, 222 and sidewall spacer 226. In one embodiment, interlayer 250 is insulation material similar to insulator 238.

Figure 19:
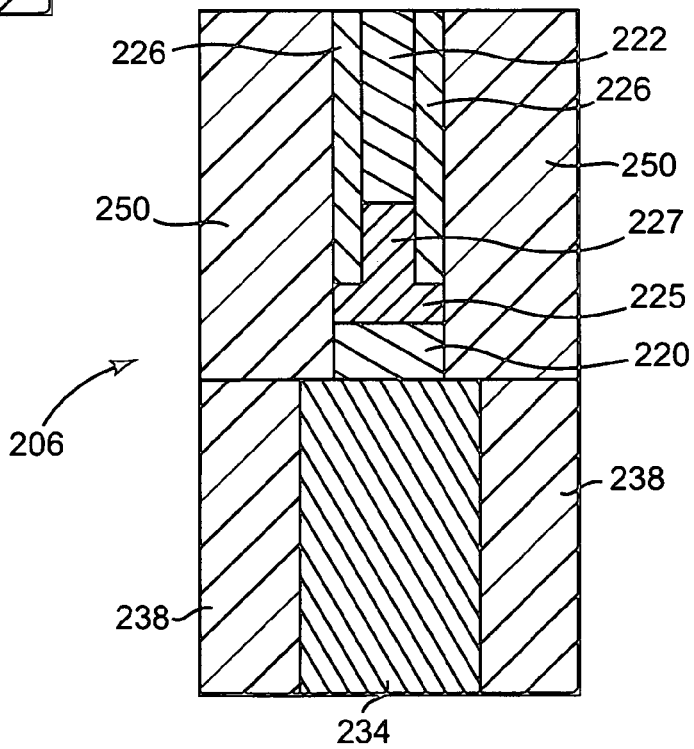
FIG. 19 illustrates a cross-sectional view of a planarized memory cell suitable for subsequent wiring/processing according to one embodiment of the present invention.

FIG. 19 illustrates a cross-sectional view of memory cell 206 according to one embodiment of the present invention. In one embodiment, interlayer 250 (FIG. 18) is planarized using a chemical mechanical polishing (CMP), or other suitable planarizing techniques, to define memory cell 206, which is thereafter configured for subsequent further wiring/processing in accordance with aspects of the present invention.

Figure 20A:
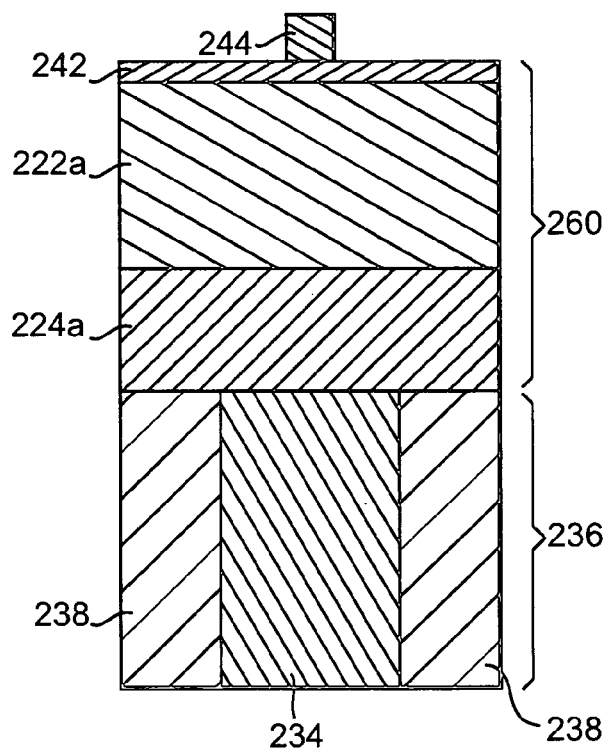
FIG. 20A illustrates a cross-sectional view of a memory cell stack disposed on a pre-processed wafer according to another embodiment of the present invention.

FIG. 20A illustrates a memory cell stack 260 according to another embodiment of the present invention. Memory cell stack 260 includes layer 224a of phase change material, second electrode layer 222a, a hard mask/stop etch layer 242 over second electrode layer 222a, and a photo resist 244 masking over hard mask/stop etch layer 242. In one embodiment, first electrode layer 220a (FIG. 13) is an optional layer that is not provided. In this embodiment, layer 224a of phase change material is directly deposited onto electrode plug 234 of pre-processed wafer 236.

Figure 20B:
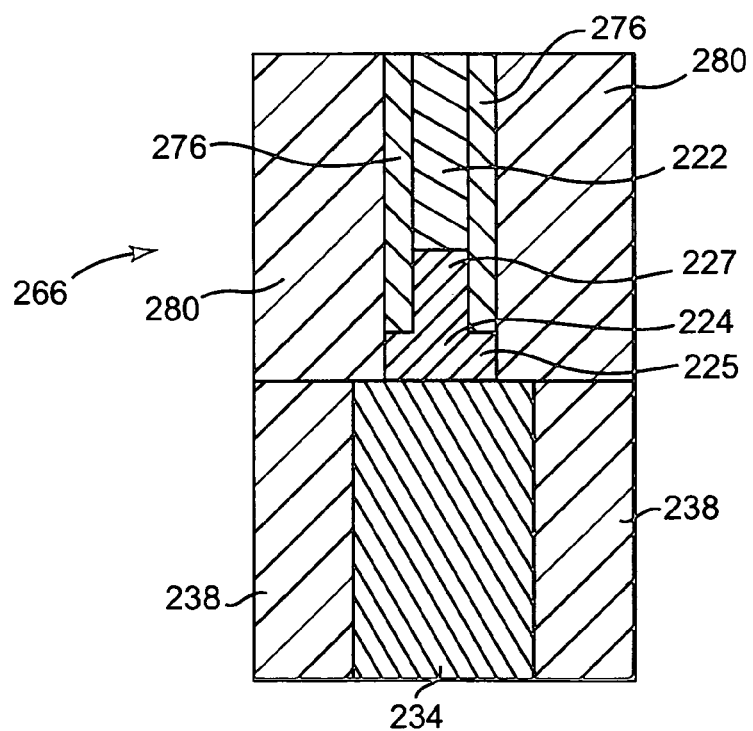
FIG. 20B illustrates a cross-sectional view of a memory cell according to another embodiment of the present invention.

FIG. 20B illustrates a cross-sectional view of a memory cell 266 according to one embodiment of the present invention. Memory cell 266, after processing memory cell stack 260 (FIG. 20A) in processes substantially similar to those illustrated in FIGS. 12-19, provides layer 224 of phase change material in contact with electrode plug 234, and second electrode 222 in contact with layer 224 of phase change material. Memory cell 266 includes insulator 280 that completely and laterally surrounds sidewall spacer 276. In one embodiment, layer 224 of phase change material includes base 225 in contact with electrode plug 234, and pillar 227 in contact with second electrode 222. A sidewall spacer 226 is provided and extends between a top portion of second electrode 222 and base 225 of layer 224 of phase change material. Sidewall spacer 276 contacts second electrode 222 and a sidewall 228 of layer 224 of phase change material adjacent to an upper contact with second electrode 222.

Figure 21:
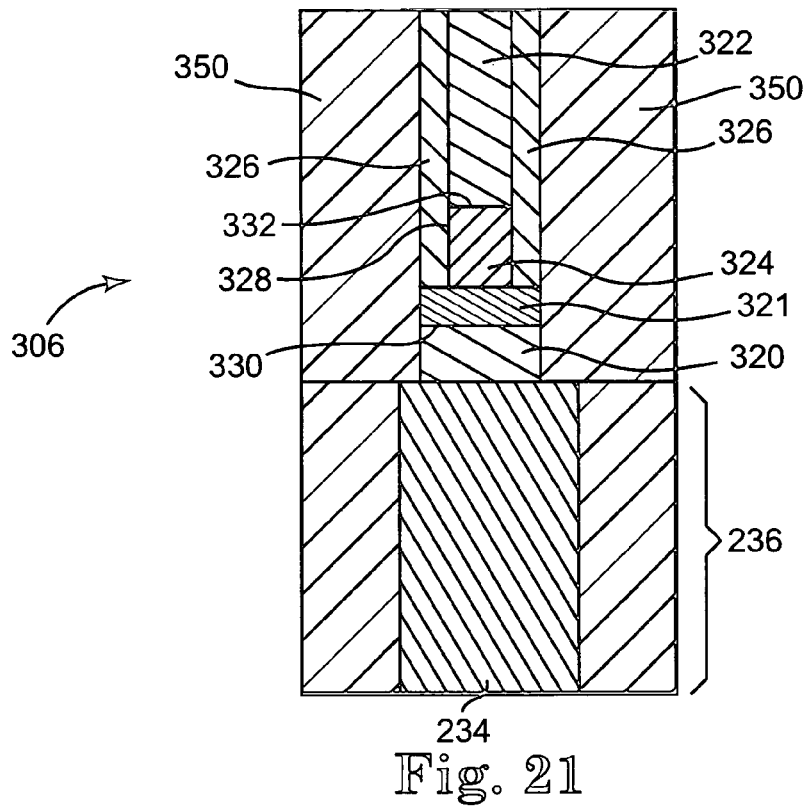
FIG. 21 illustrates a cross-sectional view of a memory cell according to another embodiment of the present invention.

FIG. 21 illustrates a cross-sectional view of a memory cell 306 according to another embodiment of the present invention. In one embodiment, memory cell 306 includes a first electrode 320, an etch stop layer 321 in contact with first electrode 320, a second electrode 322, a layer 324 of phase change material extending from etch stop layer 321 to second electrode 322, and a sidewall spacer 326 in contact with second electrode 322 and a sidewall 328 of layer 324.

In one embodiment, first electrode 320 contacts an electrode plug 234 of a pre-processed wafer 236. In this regard, electrode plug 234 and pre-processed wafer 236 are substantially similar to electrode plug 134 and pre-processed wafer 136 illustrated in FIGS. 3A and 3B.

Figure 22:
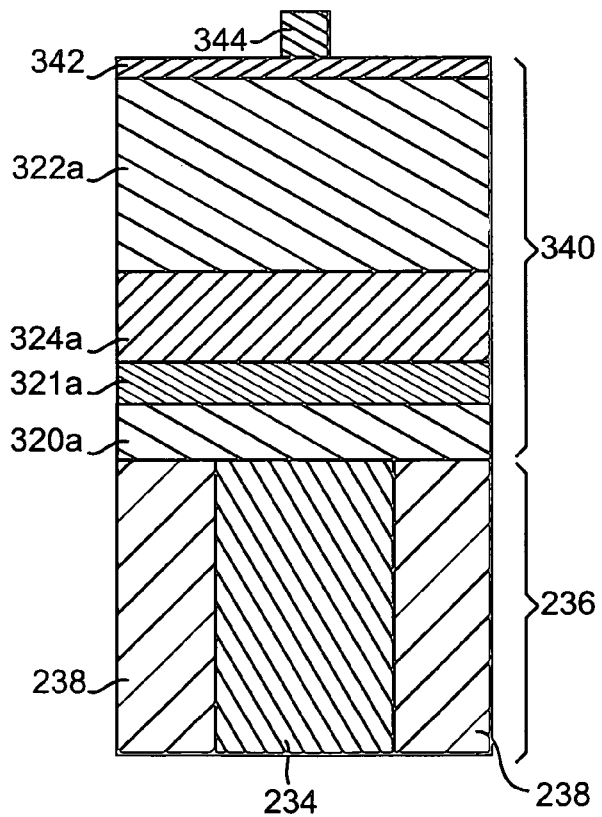
FIG. 22 illustrates a cross-sectional view of a memory cell stack including an etch stop layer and a bottom electrode disposed on a pre-process wafer according to one embodiment of the present invention.

FIG. 22 illustrates a cross-sectional view of a memory cell stack 340 disposed on a pre-processed wafer 236 according to one embodiment of the present invention. Pre-processed wafer 236 includes a plurality of electrode plugs 234 disposed in an insulation field 238. It is to be understood that although FIG. 22 illustrates one electrode plug 234, in general a pre-processed wafer such as wafer 236 will include many electrode plugs disposed in an insulation field (for example, substantially as shown in FIGS. 3A and 3B).

Memory cell stack 340 includes first electrode layer 320a, etch stop layer 321 a, second electrode layer 322a, a layer 324a of phase change material extending between etch stop layer 321a and second electrode layer 322a, a hard mask 342 deposited onto second electrode layer 322a, and a photo resist layer 344 contacting hard mask 342. In one embodiment, photo resist layer 344 and hard mask 342 are similar to the photo resist and hard mask materials described in FIG. 4 above.

Figure 23:
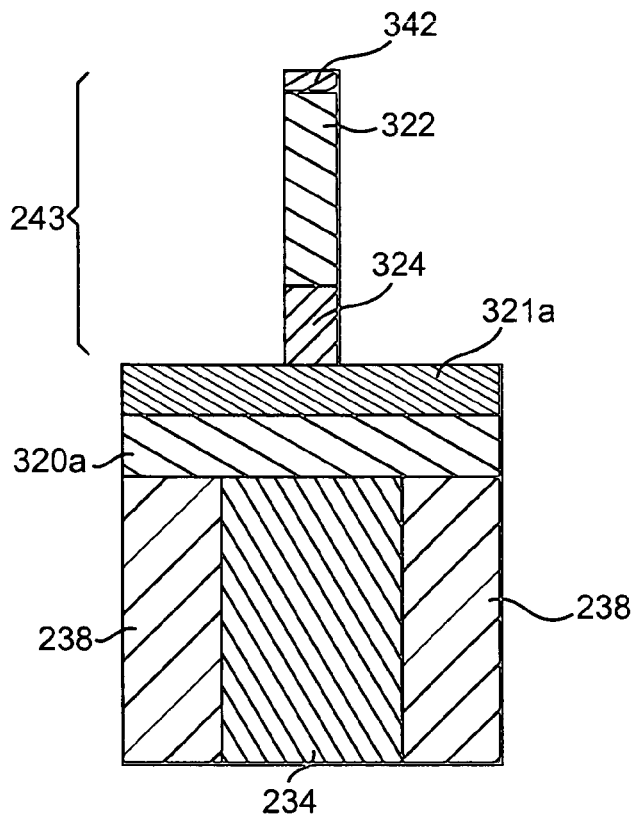
FIG. 23 illustrates a cross-sectional view of the memory cell stack illustrated in FIG. 22 after etching down to the etch stop layer and stripping according to one embodiment of the present invention.

FIG. 23 illustrates a cross-sectional view of a pillar stack 343 according to one embodiment of the present invention. Memory cell stack 340 (FIG. 22) has been etched to form a storage location pillar, and the pillar etch has been terminated at etch stop layer 321 a to define a column of phase change material 324 extending from etch stop layer 321 a. In this regard, pillar stack 343 includes a pillar of layer 324 of phase change material, second electrode 322, and a remaining portion of hard mask 342 on second electrode 322.

In one embodiment, photo resist 344 is employed in etching pillar 324 lithographically, and then photo resist 344 is subsequently stripped after pillar stack 343 is formed. In one embodiment, pillar etch is terminated at etch stop layer 321a, and etch stop layer 321a provides a relatively wider base for pillar stack 343 that, in effect, improves the structural integrity of pillar 224 and second electrode 222.

Figure 24:
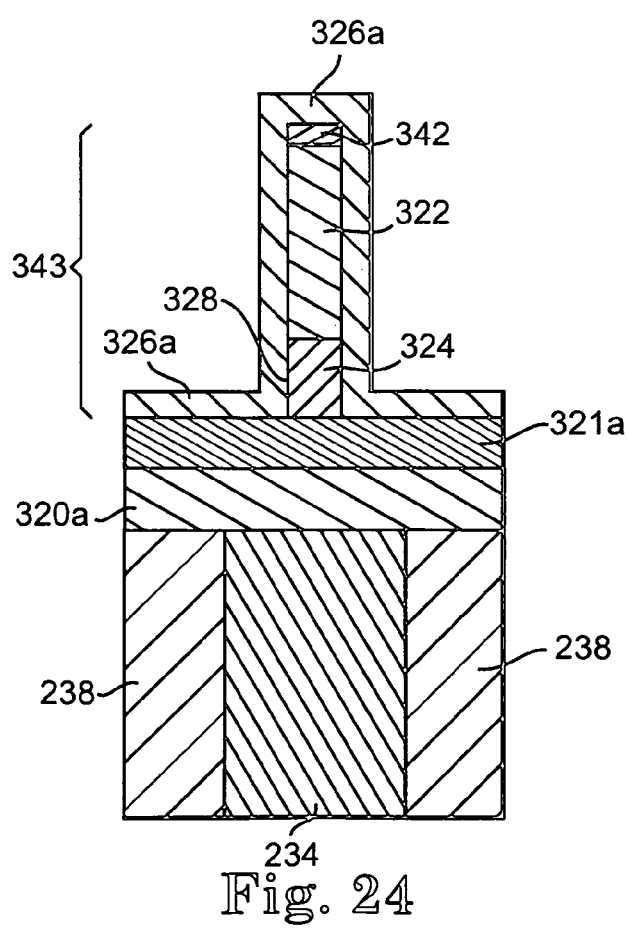
FIG. 24 illustrates a cross-sectional view of a sidewall spacer layer deposited onto the etched and stripped memory cell stack of FIG. 23 according to one embodiment of the present invention.

FIG. 24 illustrates a cross-sectional view of a sidewall spacer layer 326a deposited onto portions of pillar stack 343 according to one embodiment of the present invention. Sidewall spacer layer 326a is conformally deposited onto etch stop layer 321 and along a sidewall 228 of layer 324 of phase change material. In one embodiment, sidewall spacer layer 326a is a dielectric that is conformally deposited over pillar stack 343 in a CVD process. Other suitable deposition processes are also acceptable. Sidewall spacer layer 326a protects phase change layer 324 during subsequent etching of bottom electrode layer 320a (and etch stop layer 321a).

Figure 25:
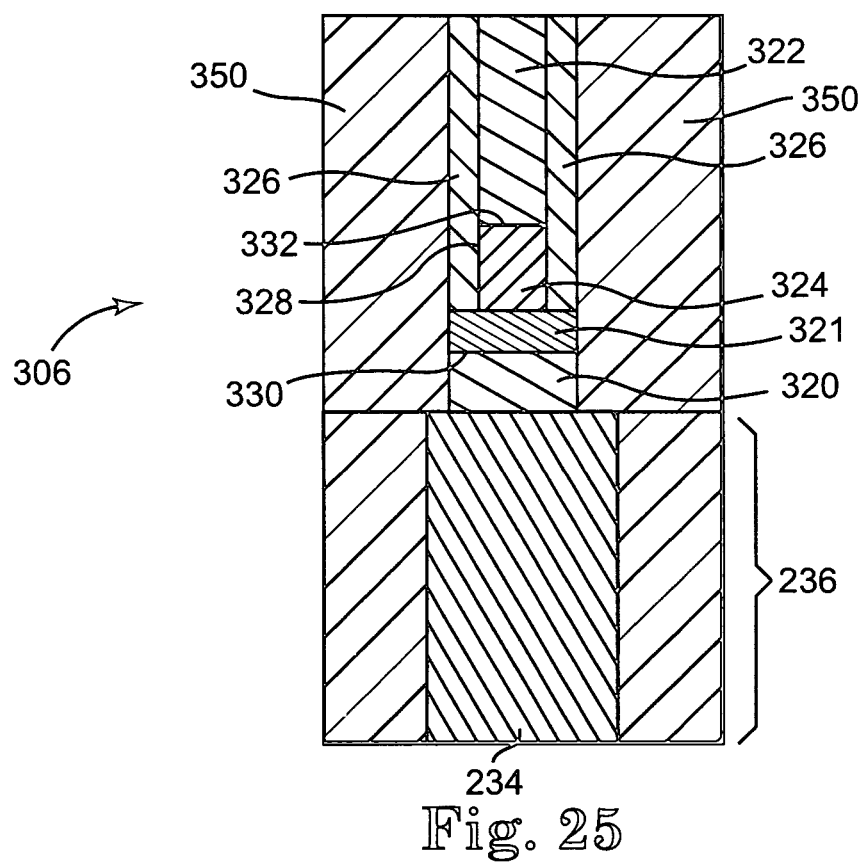
FIG. 25 illustrates a cross-sectional view of a memory cell according to the present invention.

FIG. 25 illustrates a cross-sectional view of a memory cell 306 according to the present invention. Pillar stack 343 (FIG. 24) and sidewall spacer layer 326a have been anisotropically and separation etched in a manner similar to that described above in FIGS. 16 and 17, and an interlayer dielectric 350 has been deposited in a suitable deposition process to laterally and completely surround electrodes 320, 322 and sidewall spacer 326, in a manner similar to that described above in FIG. 18.

Aspects of the invention provide a sidewall spacer that protects and improves homogeneity of a phase change material layer from over etching during, for example, a bottom electrode separation etch. Improved homogeneity of phase change material layer relates to improved structural integrity and improved, uniform electrical characteristics of phase change material layer, all of which contributes to a low power phase change memory cell structure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a wafer substrate;
a first electrode;
a second electrode;
resistivity changing material extending from a first contact with the first electrode to a second contact with the second electrode; and
a sidewall spacer contacting the second electrode and a sidewall of the resistivity changing material adjacent to the second contact, the sidewall spacer comprising a material with a higher resistance against etching than the resistivity changing material, and the sidewall spacer aligned with a portion of the first electrode in a direction perpendicular to the wafer substrate,
wherein the first electrode is between the wafer substrate and the second electrode, and
wherein the sidewall spacer comprises a first surface contacting the second electrode and a second surface coplanar with a surface of the first electrode, the second surface of the sidewall spacer being opposite to the first surface of the sidewall spacer, the first surface of the sidewall spacer and the second surface of the sidewall spacer being perpendicular to the wafer substrate, and the first surface of the sidewall spacer being spaced apart from the second surface of the sidewall spacer in a direction parallel to the wafer substrate; wherein the resistivity changing material comprises a first stack of phase change material in contact with a second stack of phase change material, wherein the first stack of phase change material is different in composition relative to the second stack of phase change material.

2. The integrated circuit of claim 1, wherein the sidewall spacer contacts the first electrode and the sidewall of the resistivity changing material adjacent to the first contact.

3. The integrated circuit of claim 1, wherein the sidewall spacer extends between the first contact with the first electrode and the second contact with the second electrode and contacts an entirety of the sidewall of the resistivity changing material.

4. The integrated circuit of claim 1, wherein the sidewall spacer comprises one of a silicon oxide, silicon nitride, silicon oxynitride, SiOCH, and a low-k dielectric material.

5. The integrated circuit of claim 1, wherein the resistivity changing material defines a width extending between opposing sidewall spacers of between about 5 nm and 50 nm.

6. The integrated circuit of claim 1, wherein a third surface of the sidewall spacer directly contacts the first electrode, the third surface of the sidewall spacer being parallel to the wafer substrate.

7. An integrated circuit comprising:
a wafer substrate;
a first electrode;
a second electrode;
resistivity changing material extending from a first contact with the first electrode to a second contact with the second electrode; and
a sidewall spacer contacting the second electrode and a sidewall of the resistivity changing material adjacent to the second contact, the sidewall spacer comprising a material with a higher resistance against etching than the resistivity changing material, and the entire sidewall spacer aligned with a portion of the first electrode in a direction perpendicular to the wafer substrate,
wherein the first electrode is between the wafer substrate and the second electrode,
wherein the resistivity changing material comprises a lateral base contacting the first contact of the first electrode and a pillar disposed on a portion of the lateral base, the pillar contacting the second contact of the second electrode and extending substantially orthogonally from the base, and
wherein the pillar is narrower than the base; wherein the resistivity changing material comprises a first stack of phase change material in contact with a second stack of phase change material, wherein the first stack if phase change material is different in compistition relative to the second stack of phase change material.

8. The integrated circuit of claim 7, wherein the sidewall spacer extends along the pillar from the base to the second contact of the second electrode.

9. An integrated circuit comprising:
a wafer substrate;
a first electrode;
a second electrode;
resistivity changing material extending from a first contact with the first electrode to a second contact with the second electrode; and
a sidewall spacer contacting the second electrode and a sidewall of the resistivity changing material adjacent to the second contact, the sidewall spacer comprising a material with a higher resistance against etching than the resistivity changing material, and the sidewall spacer aligned with a portion of the first electrode in a direction perpendicular to the wafer substrate,
wherein the first electrode is between the wafer substrate and the second electrode,
wherein the resistivity changing material comprises a first stack of phase change material in contact with a second stack of phase change material,
wherein the first stack of phase change material is different in composition relative to the second stack of phase change material.

10. A memory cell comprising:
a wafer substrate;
a pillar phase change cell defined by a column of phase change material extending between opposing first and second electrodes; and
a sidewall protection spacer contacting a perimeter of at least a portion of the column of phase change material and a perimeter of at least a portion of the second electrode, the sidewall protection spacer comprising a material with a higher resistance against etching than the phase change material, and the sidewall protection spacer aligned with a portion of the first electrode in a direction perpendicular to the wafer substrate,
wherein the first electrode is between the wafer substrate and the second electrode, and
wherein the sidewall protection spacer comprises a first surface contacting the second electrode and a second surface coplanar with a surface of the first electrode, the second surface of the sidewall protection spacer being opposite to the first surface of the sidewall protection spacer, the first surface of the sidewall protection spacer and the second surface of the sidewall protection spacer being perpendicular to the wafer substrate, and the first surface of the sidewall protection spacer being spaced apart from the second surface of the sidewall protection spacer in a direction parallel to the wafer substrate;
wherein the phase change material comprises a first stack of phase change material in contact with a second stack of phase change material, wherein the first stack of phases change material is different in composition relatve to the second stack of phase change material.

11. The memory cell of claim 10, wherein the sidewall protection spacer contacts a perimeter of an entirety of the column of phase change material.

12. The memory cell of claim 10, wherein the second electrode is a top electrode and the sidewall protection spacer contacts a perimeter of the column of phase change material adjacent to the top electrode.

13. The memory cell of claim 10, wherein the sidewall protection spacer comprises a plurality of layers, at least one of the layers comprising one of a silicon oxide, silicon nitride, silicon oxynitride, SiOCH, and a low-k dielectric material.

14. The memory cell of claim 10, wherein a third surface of the sidewall protection spacer directly contacts the first electrode, the third surface of the sidewall protection spacer being parallel to the wafer substrate.

15. A memory cell comprising:
a wafer substrate;
a pillar phase change cell defined by a column of phase change material extending between opposing first and second electrodes; and
a sidewall protection spacer contacting a perimeter of at least a portion of the column of phase change material and a perimeter of at least a portion of the second electrode, the sidewall protection spacer comprising a material with a higher resistance against etching than the phase change material, and the entire sidewall protection spacer aligned with a portion of the first electrode in a direction perpendicular to the wafer substrate,
wherein the first electrode is between the wafer substrate and the second electrode,
wherein the column of phase change material is disposed on a portion of a lateral base of phase change material, the column of phase change material contacting the second electrode and the lateral base of phase change material contacting the first electrode, and wherein the column of phase change material is narrower than the lateral base of phase change material; wherein the phase change material comprises a first stack of phase change material in contact with a second stack of phase change material, wherein the first stack of phases change material is different in composition relatve to the second stack of phase change material.

16. A memory device comprising:

a distribution circuit;

a write pulse generator electrically coupled to the distribution circuit;

a sense circuit electrically coupled to the distribution circuit and electrically coupled to the write pulse generator through a signal path; and an array of memory cells formed on a wafer substrate, the array of memory cells electrically coupled to the distribution circuit, each memory cell comprising:

a pillar phase change cell defined by a column of phase change material extending between opposing first and second electrodes; and a sidewall spacer contacting a perimeter of at least a portion of the column of phase change material and a perimeter of at least a portion of the second electrode, the sidewall spacer comprising a material with a higher resistance against etching than the phase change material, and the entire sidewall spacer aligned with a portion of the first electrode in a direction perpendicular to the wafer substrate, wherein the first electrode is between the wafer substrate; wherein the phase change material comprises a first stack of phase change material in contact with a second stack of phase change material, wherein the first stack of phases change material is different in composition relative to the second stack of phase change material and the second electrode.

17. The memory device of claim 16, wherein the sidewall spacer extends along an entirety of the column of phase change material.

18. The memory device of claim 16, wherein the sidewall spacer comprises one of a silicon oxide, silicon nitride, silicon oxynitride, SiOCH, and a low-k dielectric material.

19. The memory device of claim 16, wherein the column of phase change material defines a width extending between the sidewall spacer of between about 5 nm and 50 nm.

20. The memory device of claim 16, wherein a surface of the sidewall spacer directly contacts the first electrode, the surface of the sidewall spacer being parallel to the wafer substrate.

* * * * *